(12) United States Patent
Leung et al.

(10) Patent No.: US 8,772,083 B2
(45) Date of Patent: Jul. 8, 2014

(54) SOLDER MASK WITH ANCHOR STRUCTURES

(75) Inventors: Andrew K W Leung, Markham (CA); Roden R. Topacio, Markham (CA); Yu-Ling Hsieh, Xindian (TW); Yip Seng Low, Thornhill (CA)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/229,687

(22) Filed: Sep. 10, 2011

(65) Prior Publication Data
US 2013/0062786 A1    Mar. 14, 2013

(51) Int. Cl.
*H01L 21/00* (2006.01)
*H01L 21/31* (2006.01)

(52) U.S. Cl.
USPC .............. 438/106; 438/759; 257/E23.021; 257/E23.001

(58) Field of Classification Search
None
See application file for complete search history.

(56) References Cited

U.S. PATENT DOCUMENTS

| | | | |
|---|---|---|---|
| 5,218,234 A | 6/1993 | Thompson et al. | |
| 5,953,814 A | 9/1999 | Sozansky et al. | |
| 6,074,893 A | 6/2000 | Nakata et al. | |
| 6,246,124 B1 | 6/2001 | Jimarez et al. | |
| 6,448,507 B1 * | 9/2002 | Fontecha et al. | 174/260 |
| 6,614,122 B1 | 9/2003 | Dory et al. | |
| 2002/0028533 A1 | 3/2002 | Tang et al. | |
| 2003/0171001 A1 * | 9/2003 | Shinohara | 438/758 |
| 2004/0080055 A1 * | 4/2004 | Jiang | 257/783 |
| 2004/0169275 A1 * | 9/2004 | Danvir et al. | 257/737 |
| 2008/0169555 A1 | 7/2008 | Topacio et al. | |
| 2008/0277802 A1 | 11/2008 | Tsai et al. | |
| 2009/0236756 A1 * | 9/2009 | Kim et al. | 257/778 |
| 2010/0019381 A1 * | 1/2010 | Haeberlen et al. | 257/737 |

FOREIGN PATENT DOCUMENTS

| | | |
|---|---|---|
| EP | 1732117 | 12/2006 |
| WO | WO 2006/129135 | * 12/2006 |
| WO | WO2006129135 | 12/2006 |
| WO | WO 2006129135 A1 | * 12/2006 |

OTHER PUBLICATIONS

PCT/US2012/052525 International Search Report mailed Nov. 7, 2012.
PCT/CA2011/000252 International Search Report mailed Jun. 21, 2011.
USPTO Office Action notification date Jun. 8, 2012; U.S. Appl. No. 12/721,243.
USPTO Office Action notification date Jan. 4, 2013; U.S. Appl. No. 12/721,243.
PCT/CA2011/000252 Extended European Search Report mailed Nov. 21, 2013.

* cited by examiner

*Primary Examiner* — Julio J Maldonado
*Assistant Examiner* — Harpreet Singh
(74) *Attorney, Agent, or Firm* — Timothy M. Honeycutt (57) ABSTRACT

Various substrates or circuit boards for receiving a semiconductor chip and methods of processing the same are disclosed. In one aspect, a method of manufacturing is provided that includes forming a first opening in a solder mask positioned on a side of a substrate. The first opening does not extend to the side. A second opening is formed in the solder mask that extends to the side. The first opening may serve as an underfill anchor site.

12 Claims, 7 Drawing Sheets

SOLDER MASK WITH ANCHOR STRUCTURES

BACKGROUND OF THE INVENTION

1. Field of the Invention

This invention relates generally to semiconductor processing, and more particularly to semiconductor chip circuit board or substrate underfill anchor structures and to methods of making the same.

2. Description of the Related Art

Flip-chip mounting schemes have been used for decades to mount semiconductor chips to circuit boards, such as semiconductor chip package substrates. In many conventional flip-chip variants, a plurality of solder joints is established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

Flip-chip solder joints may be subjected to mechanical stresses from a variety of sources, such as coefficient of thermal expansion (CTE) mismatches, ductility differences and circuit board warping. Such stresses can subject the just described conventional solder joints to bending moments. The effect is somewhat directional in that the stresses tend to be greatest nearer the die edges and corners and fall off with increasing proximity to the die center.

To lessen the effects of CTE mismatch, underfill materials are routinely placed between a chip and the underlying package substrate, and more particularly between the chip and a solder resist layer on the package substrate. Like the solder joints, even the underfill may be subjected to bending moments. If severe enough or if the bonding of the underfill to the solder mask is locally weakened, delamination can occur. Underfill delamination can cause cracks to form in the solder joints and ultimately lead to device failure.

One conventional design utilizes a polyimide layer on the semiconductor chip to provide protection for various conductor structures positioned near the outermost surface of a semiconductor chip. Openings are formed in the polyimide layer to lead to the underlying metal structures. Additional openings are formed in the polyimide layer extending through to the semiconductor chip. These additional holes serve as anchor spots for underfill material to inhibit underfill delamination. However, the additional holes render the polyimide layer unsuitable as an etch mask.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a first opening in a solder mask positioned on a side of a substrate. The first opening does not extend to the side. A second opening is formed in the solder mask that extends to the side.

In accordance with another aspect of an embodiment of the present invention, a method of manufacturing is provided that includes coupling a semiconductor chip to a side of a substrate. The side includes a solder mask that has a first opening that does not extend to the side. An underfill is placed between the semiconductor chip and the solder mask. A portion of the underfill projects into the first opening.

In accordance with another aspect of an embodiment of the present invention, an apparatus is provided that includes a substrate that has a side. A solder mask is on the side. The solder mask includes a first opening that does not extend to the side.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a substrate or circuit board capable of receiving a semiconductor chip are described herein. One example includes a solder mask provided with one or more openings that do not extend through the entire depth of the solder mask. The openings provide locations for underfill material projections to form mechanical linkages and inhibit underfill delamination. Additional details will now be described.

Figure 1:
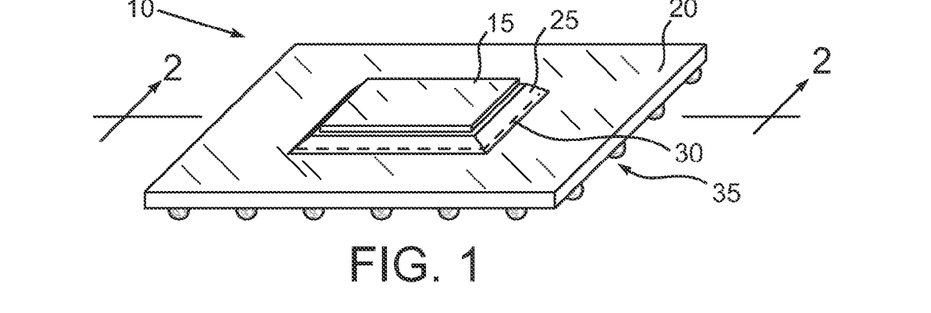
FIG. 1 is a pictorial view of an exemplary embodiment of a semiconductor chip device that includes a semiconductor chip flip-chip mounted on a substrate.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 mounted on a substrate 20 that may be a circuit board. To help alleviate differential strain rate issues associated with mismatches between the coefficients of thermal expansion of the semiconductor chip 15 and, among other things the circuit board 20, an underfill material 25 is placed between the semiconductor chip 15 and the circuit board 20. A portion of the underfill 25 is visible as a bead that tracks the perimeter, represented by the dashed line 30, of the semiconductor chip 15. The circuit board 20 may be mounted to another electronic device, such as another circuit board (not shown in FIG. 1) and electrically interfaced therewith by an input/output scheme such as the depicted ball grid array 35. Optionally, a land grid array, a pin grid array or other interface structure may be used as desired.

Figure 2:
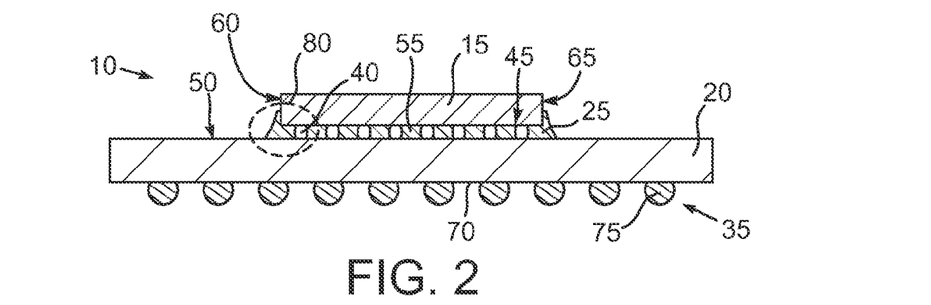
FIG. 2 is a sectional view of FIG. 1 taken at section 2-2.

Additional details of the semiconductor chip device 10 may be understood by referring to FIG. 2, which is a sectional view of FIG. 1 taken at section 2-2. The semiconductor chip 15 may be flip-chip mounted to the circuit board 20 as shown and electrically connected thereto by way of plural solder joints 40. The solder joints 40 are of such height that a lower surface 45 of the semiconductor chip 15 is elevated above an upper surface 50 of the circuit board 20 to leave a gap 55. The underfill material 25 not only fills the gap 55 but also projects slightly laterally away from the opposing edges 60 and 65 (and those edges orthogonal thereto but not visible) of the semiconductor chip 15. The underfill 25 may be composed of well-known epoxy materials, such as epoxy resin with or without silica fillers and phenol resins or the like. Two examples are types 8437-2 and 2BD available from Namics. The ball grid array 35 projects downwardly from a lower surface 70 of the circuit board 20 and consists of plural solder balls 75. Plural interconnect structures, such as metallization layers, vias and other types of structures (not visible) electrically connect the solder balls 75 to the solder joints 40.

Figure 3:
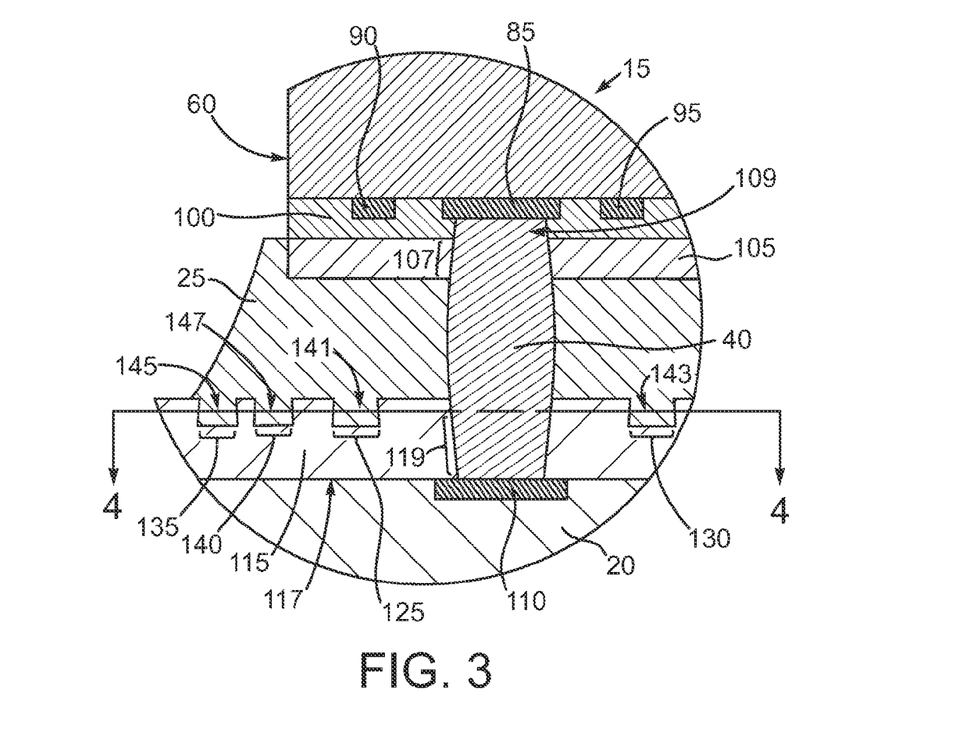
FIG. 3 is a portion of FIG. 2 shown at greater magnification.

The portion of FIG. 2 circumscribed by the dashed oval 80 will be shown at greater magnification in FIG. 3 and used to describe certain features of the circuit board 20 and the underfill 25. With that backdrop, attention is now turned to FIG. 3. Note that due to the location of the dashed oval 80, the edge 60 of the semiconductor chip 15 as well as a small portion of the circuit board 20 are visible. The semiconductor chip 15 may include multiple levels of interconnect structures, such as metallization layers, interconnecting vias, etc. A few of these conductor structures are depicted. In particular, a bump pad 85 and a couple of metallization traces 90 and 95 are depicted. One end of the solder joint 40 is metallurgically bonded to the conductor pad 85. The conductor pad 85 may include an optional underbump metallization structure that may consist of an adhesion layer, a solder barrier layer and either a solder wettable layer or a solder plating layer. The conductor pad 85 and the traces 90 and 95 may be composed of various conductors, such as copper, silver, nickel, platinum, gold, aluminum, palladium, alloys or laminates of these or the like.

The conductor structures 85, 90 and 95 may be coated with a passivation structure 100, which is intended to protect the conductor structures 85, 90 and 95 from physical damage and contamination prior to additional processing. Exemplary materials include silicon dioxide, silicon nitride, polyimide, laminates of these or the like. The passivation structure 100 may be coated with an optional polymer layer 105, which is designed to provide a compliant protective film and thus may be composed of a variety of materials, such as polyimide, benzocyclobutene or the like. An upper end of the solder joint 40 projects through respective openings 107 and 109 in the polymer layer 105 and the passivation structure 100. The other end of the solder joint 40 is metallurgically connected to a conductor pad 110 of the circuit board 20. The conductor pad 110 may be composed of the same types of materials described above. There may be many layers of metallization and interconnect structures such as vias, etc. in the circuit board 20 connected to the conductor pad 110 and perhaps others like it as desired. These conductor structures are not visible in FIG. 3. The solder joint 40 may consist of the reflowed combination of a solder bump and a presolder. Optionally, the presolder may be eliminated in favor of a unitary or other type of solder structure. Solder and copper pillar structures could also be used.

A solder mask 115 is positioned on a side 117 of the circuit board 20. The lower end of the solder joint 40 projects through an opening 119 in the solder mask 115 and is metallurgically bonded to the conductor pad 110. The solder mask 115 may be composed of a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd. Optionally, other materials, such as various epoxies or polymers such as polyimide, may be used.

The solder mask 115 not only serves to selectively mask portions of the circuit board 20 so that the solder joints 40 do not short to undesired areas but also includes structure to inhibit the delamination of the underfill 25. More particularly, the solder mask 115 is provided with plural openings, four of which are visible and labeled 125, 130, 135 and 140, respectively, so that projections 141, 143, 145 and 147 of the underfill 25 may interlock therewith. The projections 141, 143, 145 and 147 provide both a greater surface area for adhesive bonding between the underfill 25 and the solder mask 115 and a mechanical linkage to inhibit the delamination of the underfill 25 from the solder mask 115. Some of the openings and underfill projections, such as the openings 125 and 130 and projections 141 and 143, are positioned proximate the solder joint 40. Other openings and underfill projections, such as the openings 135 and 140 and projections 145 and 147, may be positioned at or outside the edge 60 of the semiconductor chip 15 to not only serve as an anchor for the underfill 25 but also to provide a way of restraining by way of surface tension the lateral advance of the underfill 25 during application.

It should be understood that the number and configuration of the openings 125, 130, 135 and 140 may vary greatly. In this regard, attention is now turned to FIG. 4, which is a sectional view of FIG. 3 taken at section 4-4. Note that the openings 125, 130, 135 and 140 and projections 141, 143, 145 and 147 of the underfill 25 are visible. The underfill projections 141 and 143 bracket the solder joint 40. Additional openings 149 and 150 may be formed in the solder mask 115 to accommodate respective underfill projections 151 and 153 and also bracket the solder joint 40, albeit along a different line than the openings 125 and 130 and projections 141 and 143. Similar such openings and underfill projections (not visible in FIG. 4) may be positioned around some or all of the solder joints 40. The openings 135 and 140 and underfill projections 145 and 147 may be just part of a large plurality of similar openings which may track the perimeter 30 of the semiconductor chip. Note that the opening 135 may be round and its adjacent openings may be round as well in footprint while the opening 140 may have a generally octagonal footprint like the adjacent openings. However, the skilled artisan will appreciate that any of the openings disclosed herein may have virtually any shape.

Figure 4:
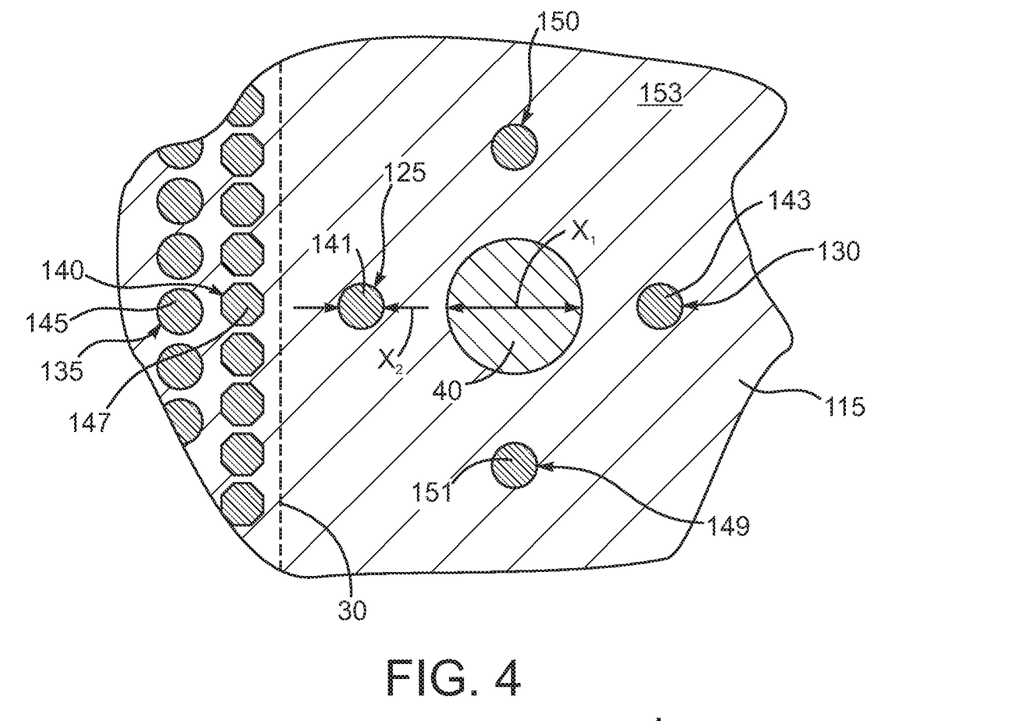
FIG. 4 is a sectional view of FIG. 3 taken at section 4-4.

In this illustrative embodiment, the solder joint 40 may have some lateral dimension $x_1$ and the openings 125, 130, 149 and 150 may have some lateral dimension and $x_2$, which may be substantially smaller than $x_1$ in this illustrative embodiment. The dimensions $x_1$ and $x_2$ may vary with depth. However, the relative relationship between the dimensions $x_1$ and $x_2$ are subject to design discretion. In illustrative embodiment, the dimension $x_1$ may about 80 µm and the dimension $x_2$ may be about 15 µm. The openings 135, 140, etc. outside the perimeter 30 of the semiconductor chip 15 may have a variety of lateral dimensions and may be relatively smaller than the dimension $x_1$ as desired. Here there are two rows of openings 135 and 140 that may track the perimeter 30 of the semiconductor chip. However, the skilled artisan will appreciate that there may be one or more of such rows and the openings 135, 140 etc. that may be arranged in a large variety of layouts.

Figure 5:
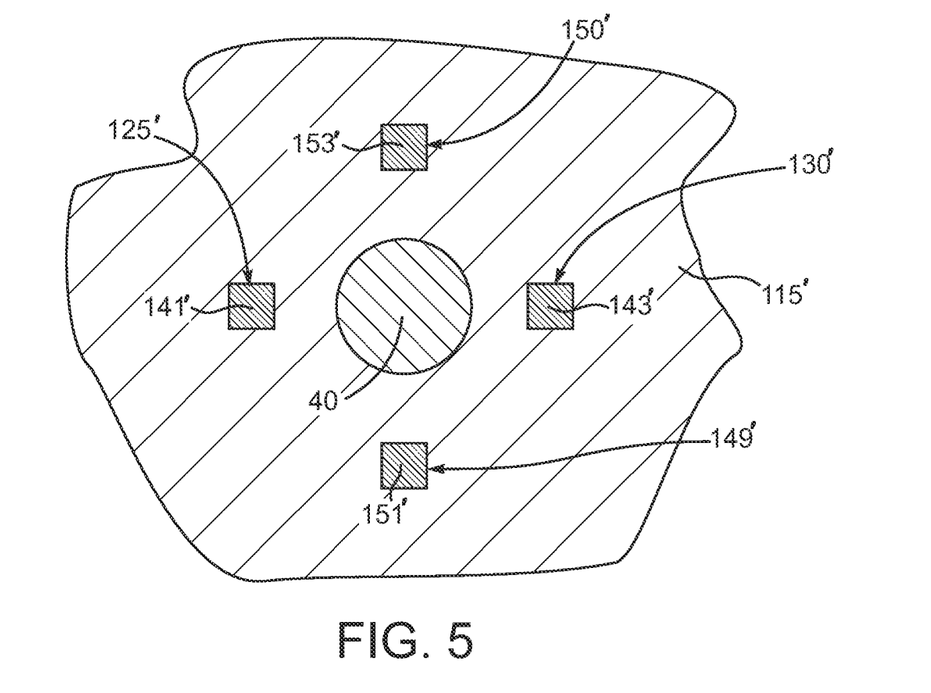
FIG. 5 is a sectional like FIG. 4, but of an alternate exemplary embodiment of a semiconductor chip device.

As just noted, the openings and underfill anchors in a solder mask may take on a variety of shapes. FIG. 5 is a sectional view like FIG. 4, but of an alternative embodiment of a solder mask 115'. Only a small portion of the solder mask 115' is shown. The solder mask 115' may have a composition as disclosed elsewhere herein. Here, however, the solder mask 115' may have plural openings 125', 130', 149' and 150' and corresponding underfill projections 141', 143', 151' and 153' that have a generally square footprint and may be positioned around a solder joint 40 and serve as anchor sites for the underfill 25 as described above. Again, the number, spatial positioning and footprint of the openings 125', 130', 149' and 150' may be subject to great variety.

An exemplary method for fabricating the solder mask 115 may be understood by referring now to FIGS. 6, 7, 8 and 9. Attention is initially turned to FIG. 6, which is a sectional view of the small portion of the circuit board 20 depicted in FIG. 3 but at a preliminary stage of processing. At this point, the conductor pad 110 and any related metallization structures (not shown) may be fabricated and the solder mask 115 applied to the surface 117 of the circuit board 20. The solder mask 115 may be applied by spin coating or other application techniques. Following spin coating, a thermal cure may be performed. As described more fully below, the various openings 125, 130, 135 and 140 depicted in FIG. 3 may be formed in the solder mask 115 in a variety of ways. In this illustrative embodiment, the solder mask 115 may be infused with photoactive compounds and photolithography steps performed in order to fashion the desired openings.

Figure 7:
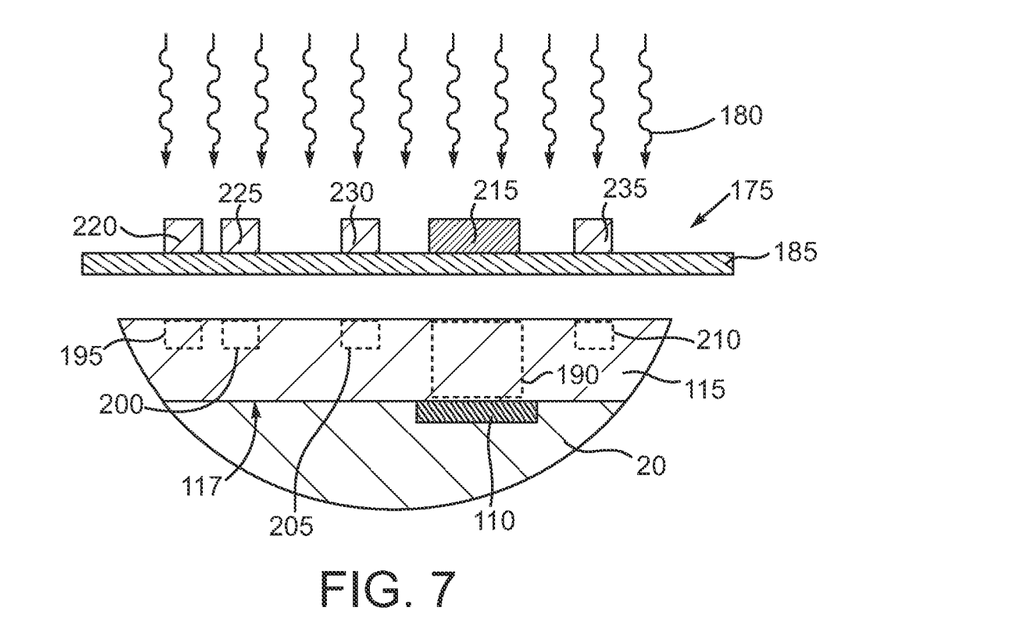
FIG. 7 is a sectional view like FIG. 6 depicting the solder mask undergoing an exemplary photolithographic exposure.

As shown in FIG. 7, a suitable lithography mask 175 may be positioned over the solder mask 115 and an exposure with radiation 180 may be performed. The mask 175 may be a non-contact photomask that is placed on the solder mask 115. The mask 175 includes a translucent plate 185 upon which plural fully opaque or semi-opaque structures are patterned. A technical goal of the lithography process is to fabricate an opening at location 190 that is full depth and thus extends all the way to the conductor pad 110 while at the same time providing the openings at locations 195, 200, 205 and 210 that are less than full depth, that is do not extend to the surface 117 of the circuit board 20. An opaque structure 215 composed of chrome or other typical lithography mask or reticle structures may be fabricated with a suitable footprint and at a position such that the portion 190 of the solder mask 115 will not be exposed to the radiation 180. However, the other mask structures 220, 225, 230 and 235 may be composed of materials or fabricated with structural features that allow for partial transmission of the incident exposure radiation 180. In this way, the exposure radiation 180 is attenuated but not blocked, resulting in less than full depth exposure at the locations 195, 200, 205 and 210. The semi-transmissive structures 230 and 235 advantageously have the footprint of the openings 125 and 130 shown in FIG. 3 and the semi-transmissive structures 220 and 225 advantageously have the footprints of the openings 135 and 140, for example, shown in FIGS. 3 and 4.

Figure 8:
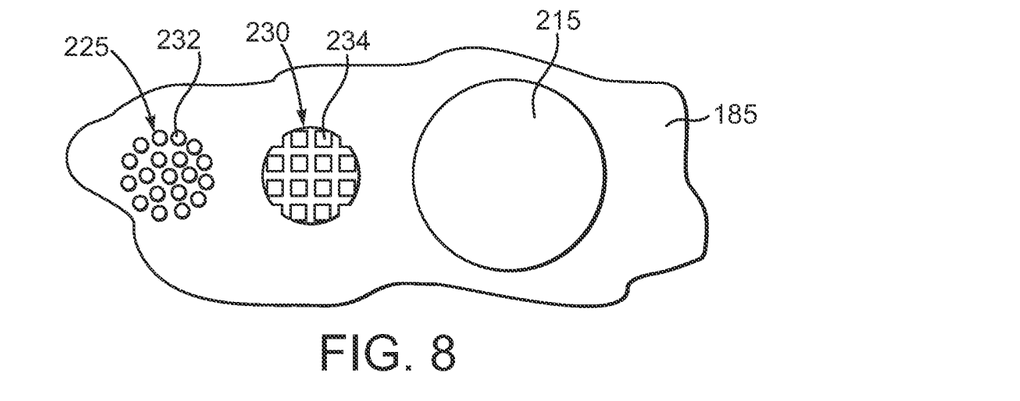
FIG. 8 is a plan view of a portion of an exemplary lithography mask.

Some exemplary embodiments of semi-transmissive structures may be understood by referring now also to FIG. 8, which is a plan view of portion of the mask 175 that includes the opaque structure 215 and the semi-transmissive structures 225 and 230 on the transparent plate 185. Here, the semi-transmissive portion 225 may consist of plural cylindrical structures 232 clustered into the desired footprint. The cylindrical structures 232 attenuate the incident radiation 180. The semi-transmissive portion 230 may consist of a mesh arrangement with plural openings 234. Again, the mesh and openings 234 attenuate the incident radiation 180. Of course, the types of structural features that may be used for the semi-transmissive structures 225, 230 and any of the others disclosed herein are legion. Partial attenuation may be accomplished in other ways. Optionally, a partially transmissive coating (not shown) may be used on or an attenuating material (not shown) may be infused into the transmissive plate 185.

Figure 9:
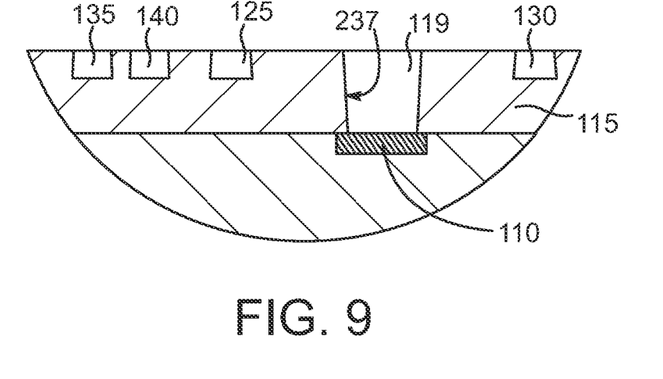
FIG. 9 is a sectional view like FIG. 7 depicting photolithographic development to yield various openings in the solder mask.

Following the exposure, the mask 175 may be removed and the solder mask 115 developed in a suitable developer solution to yield the partial depth openings 125, 130, 135 and 140 and the full depth opening 119 as shown in FIG. 9. In an exemplary embodiment where the solder mask 115 is about 10 to 20 µm thick and composed of PSR-4000, broadband light at about 130 Mjoules/cm$^3$ for about 5 to 10 seconds may be used. A variety of developers may be used. In an exemplary embodiment, a mixture of about 48% cylohexane, about 60% cylopentane and about 1% methanol may be used. Note that any or all of the openings 125, 130, 135 and 140 may have tapered sidewalls to enhance anchoring. For example, the opening 125 has a sidewall 237 that may taper outwardly with increasing depth.

After developing, a second thermal cure is performed on the solder mask 115. To neutralize any remaining photoactive compounds in the solder mask 115, a blanket exposure to UV light may be performed. With the openings 119, 125, 130, 135 and 140 formed, flip-chip mounting can then proceed as described elsewhere herein.

Figure 10:
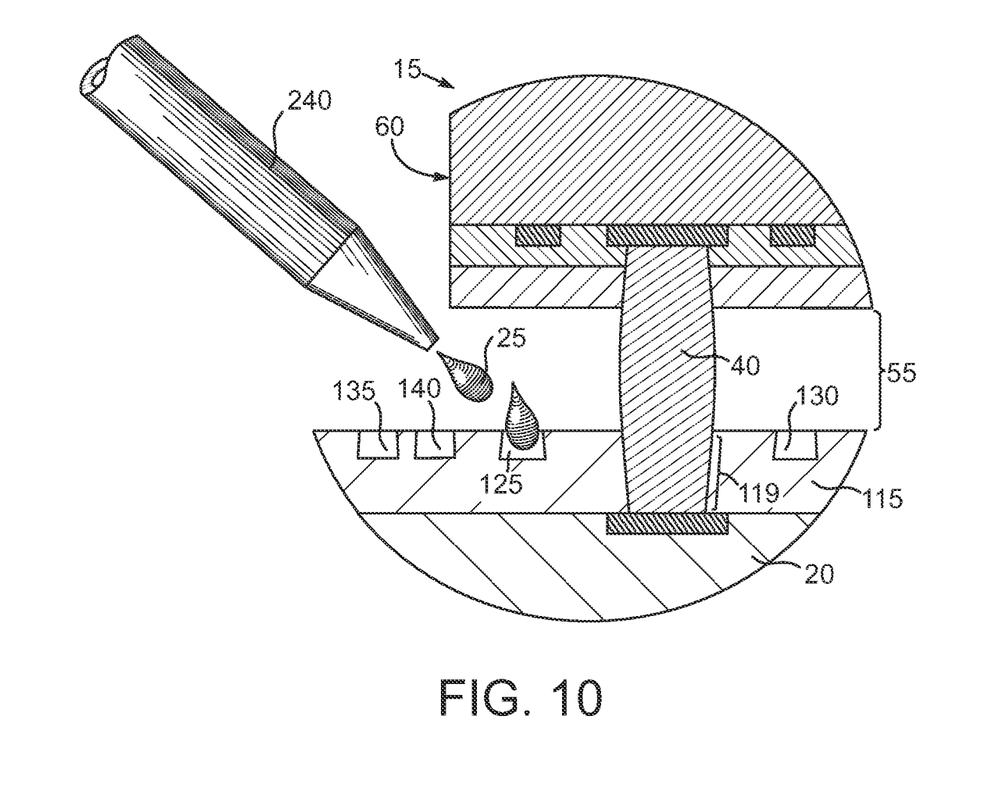
FIG. 10 is a sectional view depicting flip-chip mounting and underfill application.

As shown in FIG. 10, with the openings 125, 130, 135 and 140 formed in the solder mask 115, the semiconductor chip 15 may be flip-chip mounted to the circuit board 20 and connected thereto by way of the solder joint 40. The flip-chip mounting and the production of the solder joint 40 may involve bringing separate pieces of the solder joint 40 into proximity and performing a reflow or depending upon the composition of the solder joint 40, just one piece that fills the opening 119 or some other technique. Following the flip-chip mounting and reflow process, a suitable applicator 240 may be used to dispense the underfill 25 into the gap 55 between the semiconductor chip 15 and the solder mask 115 and thus fill not only the gap 55 but also fill the openings 125, 130, 135 and 140. As noted above, as the underfill 25 proceeds laterally away from the edge 60 of the semiconductor chip, the openings 135 and 140 and others like them will act as a retardant to additional lateral progression of the underfill 25 from the edge 60. A suitable underfill bake may follow dispensing.

Figure 6:
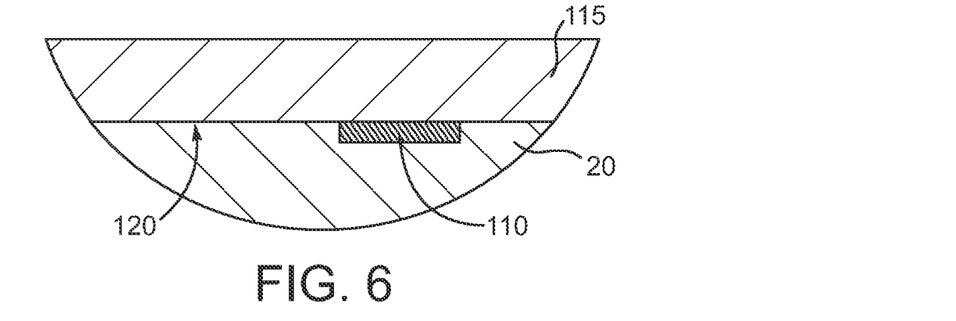
FIG. 6 is a sectional view depicting a small portion of an exemplary substrate or circuit board following solder mask application.
Figure 11:
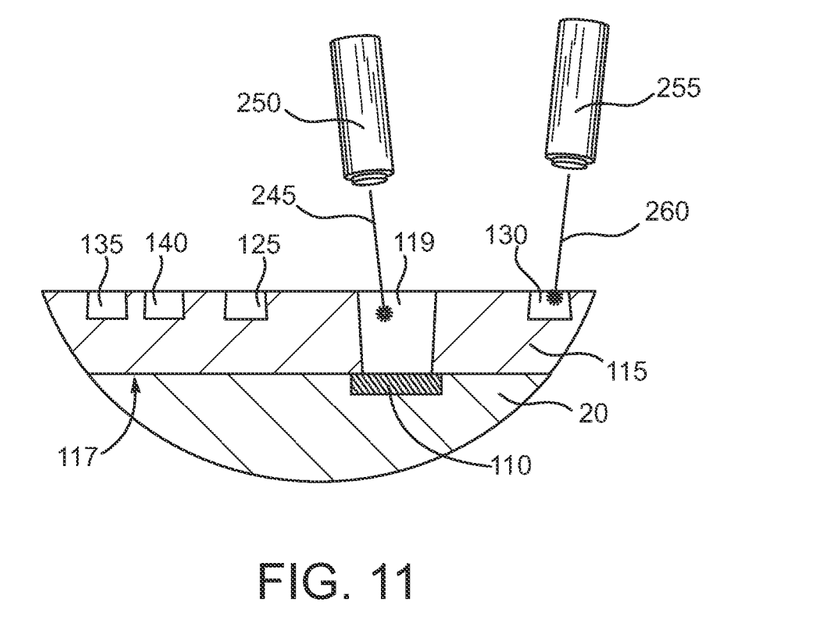
FIG. 11 is a sectional view of a small portion of an exemplary substrate or circuit board following solder mask application and depicting laser drilling of various openings in the solder mask.

Another alternate exemplary method for fabricating the openings 125, 130, 135 and 140 may be understood by referring now to FIG. 11, which is a sectional view like FIG. 6 and thus depicts the small portion of the circuit board 20 and the solder mask 115. The solder mask 115 may be applied to the circuit board 20 using the techniques described elsewhere herein. Here however, in lieu of using photoactive compounds and photolithography to form the openings 125, 130, 135, 140 and 119, laser drilling may be used. The opening 119 may be laser drilled through the full depth of the solder mask 115 to reach the underlying conductor pad 110 using a laser radiation 245 from a laser source 250. The remaining openings that do not project to the surface 117 of the circuit board 20 may be laser drilled using the same laser source 250 and laser radiation 245 but with shorter drilling times. Optionally, another laser source 255 having a lower power laser radiation 260 output may be used to drill the shallower openings 125, 130, 135 and 140. A descumming process should be performed following the laser drilling of the openings 125, 130, 135, 140 and 119. Following the descumming process, the semiconductor chip 15 may be flip-chip mounted and the underfill 25 dispensed as generally described above in conjunction with FIG. 10. Laser radiation in the UV range, green bands, from $CO_2$ sources or other frequencies may be used.

Figure 12:
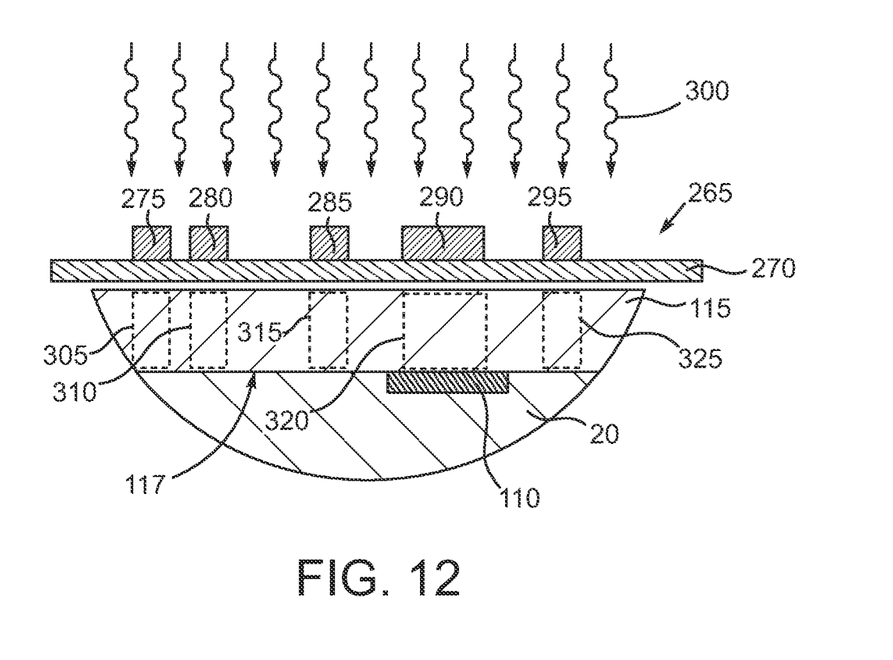
FIG. 12 is a sectional view of a small portion of an exemplary substrate or circuit board following solder mask application and depicting a first photolithographic exposure.
Figure 13:
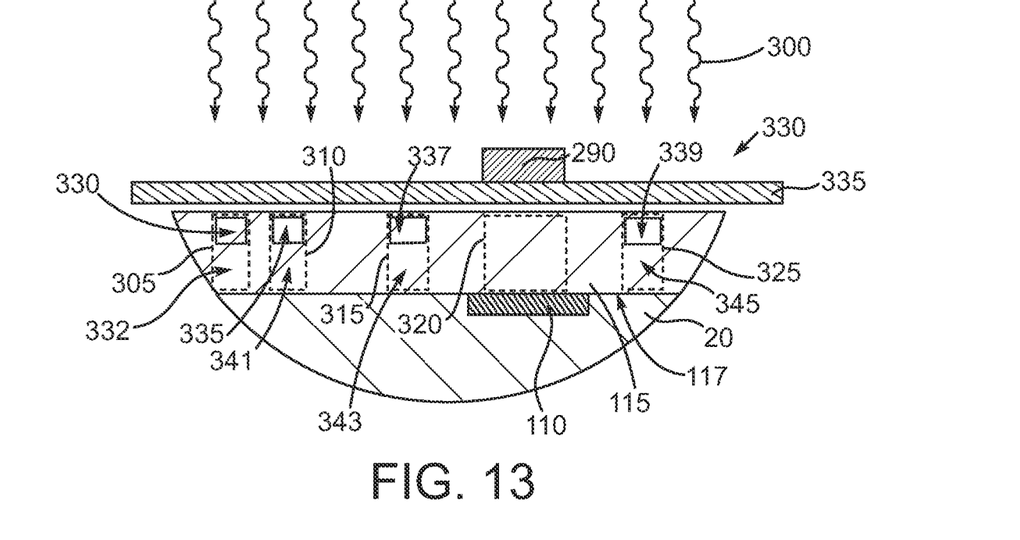
FIG. 13 is a sectional view like FIG. 12 depicting the solder mask undergoing a second photolithographic exposure.

In yet another alternate exemplary method, a two-stage masking process may be used along with photoactive compounds in the solder mask in order to fabricate a full depth solder mask opening concurrently with partial depth solder mask openings. In this regard, attention is now turned to FIGS. 12 and 13, which are sectional views like FIG. 7, and thus depict the small portion of the circuit board 20 and the solder mask 115. The solder mask 115 may be applied and initially thermally cured as described elsewhere herein. At this stage, a non-contact photomask 265 may be placed over the solder mask 115. The non-contact mask 265 includes a transparent substrate 270 and opaque structures 275, 280, 285, 290 and 295. The opaque structures 275, 280, 285 and 295 advantageously have the footprints associated with the openings 135, 140, 125 and 130, respectively as shown in FIG. 8. The opaque structure 290 has the footprint associated with the opening 119 shown in FIG. 8. Chrome or the like may be used for the opaque structures 275, 280, 285, 290 and 295 and some sort of glass or other suitable material for the substrate 270. Optionally, a photolithography mask may be formed on the solder mask 115 and patterned lithographically by well-known techniques. Thereafter, an exposure process is performed in order to expose the unmasked portions of the solder mask 115 and render them insoluble in a subsequent developing solution. Following the exposure, the mask 265 may be removed, or stripped by ashing, solvent stripping or the like if formed of resist. Suitable exposure parameters will depend on the characteristics of the solder mask 115, such as thickness and composition. In an exemplary embodiment where the solder mask 115 is about 10 to 20 nm thick and composed of PSR-4000, broadband light at about 130 Mjoules/cm$^3$ for about 5 to 10 seconds may be used. Following the exposure, unexposed portions represented schematically by the dashed boxes 305, 310, 315, 320 and 325 remain in the solder mask 115. The unexposed portions 305, 310, 315, 320 and 325 remain fully soluble in a developer solution. If the non-contact mask 265 is removed and the solder mask 115 is developed in an appropriate developer solution at this point, then openings would be formed at the locations of the dashed boxes 305, 310, 315, 320 and 325 that extend all the way to surface 117 of the circuit board 20. While full depth dissolution remains a technical goal for the portion of the solder mask 115 in the vicinity of the dashed box 320 since the underlying pad 110 must be exposed to facilitate solder connection, such is not the case for portions of the solder mask 115 exemplified by the dashed boxes 305, 310, 315 and 325. Accordingly, and as depicted in FIG. 13, a second exposure is performed with a second non-contact mask 330 that, via the opaque structure 290, shields the unexposed portion 320 aligned with the conductor pad 110 but does not shield the areas where the unexposed portions 305, 310, 315 and 325 are located. Instead, the dosage of exposure radiation 300 is dropped low enough so that the previously fully unexposed portion 305 is bifurcated into a partially light-cured upper portion 330 and an unexposed and uncured region 332. The partially light-cured portion 330 has become only semi-resistant to dissolution in an appropriate developer solution. The previously unexposed portions 310, 315 and 325 are similarly bifurcated into partially light-cured portions 335, 337 and 339 and unexposed and uncured regions 341, 343 and 345. A technical goal is to slow dramatically the disillusion rate of the solder mask 115 in the vicinity of the partially cured portions 335, 337 and 339 so that they dissolve but not completely to the surface 117 of the circuit board 20. The second exposure may be performed using the same general parameters but with a dosage of about 65 Mjoules/cm$^3$. The non-contact mask 330 is removed and the solder mask 115 subjected to an appropriate developer solution to establish the openings 119, 125, 130, 135 and 140 shown in FIGS. 2 and 9. Because the regions 332, 341, 343 and 345 shown in FIG. 12 have not received sufficient radiation to switch solubility, the developing process does not cause the openings 125, 130, 135 and 140 shown in FIGS. 2 and 8 to project all the way to the surface 117. However, the developing process does completely penetrate to the surface 117 proximate the conductor pad 110 since that region 320 remained unexposed. A variety of developers may be used. In an exemplary embodiment, a mixture of about 48% cylohexane, about 60% cylopentane and about 1% methanol may be used.

After developing, a second thermal cure is performed on the solder mask 115. To neutralize any remaining photoactive compounds in the solder mask 115, a blanket exposure to UV light may be performed. With the openings 119, 125, 130, 135 and 140 formed, flip-chip mounting can then proceed as described elsewhere herein.

Figure 14:
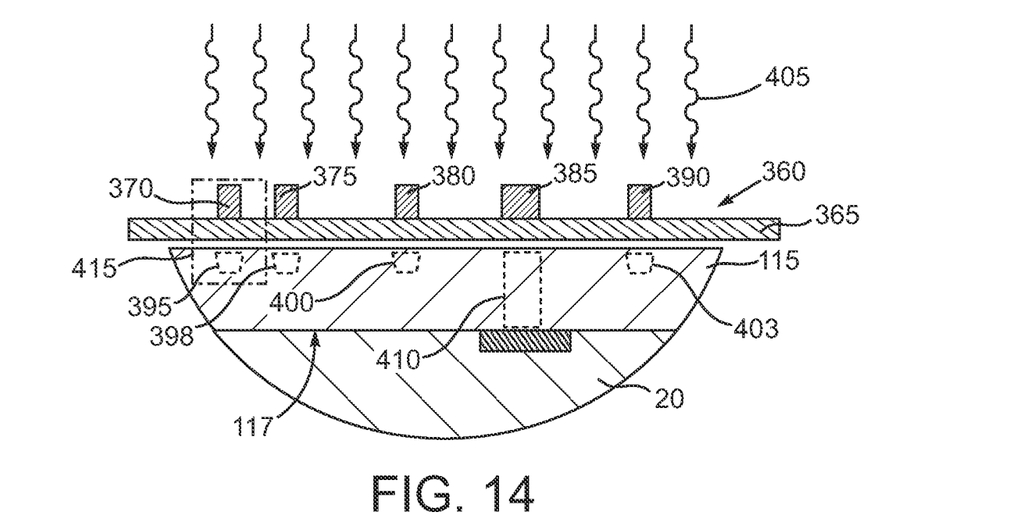
FIG. 14 is a sectional view like FIG. 12 depicting a small portion of an exemplary semiconductor chip undergoing an alternative photolithographic exposure.
Figure 15:
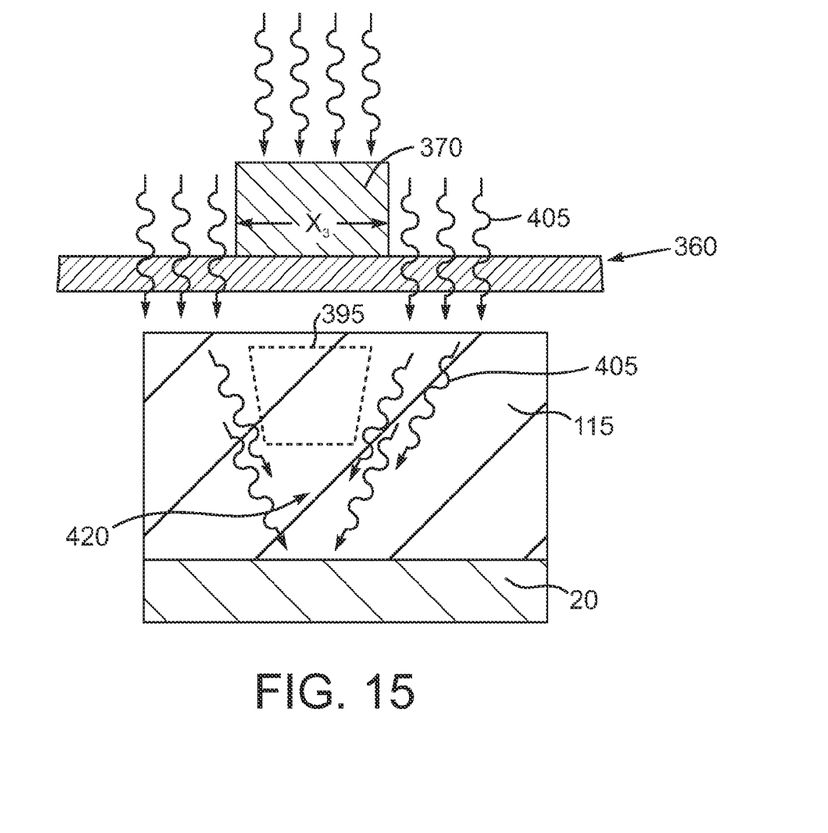
FIG. 15 is a portion of FIG. 14 shown at greater magnification.

In still another alternate exemplary method, mask footprints may be used to yield a combination of a full depth solder mask opening and less than full depth solder mask openings. In this regard, attention is now turned to FIG. 14 which is a sectional view like FIG. 7 and thus depicts the small portion of the circuit board 20 and the solder mask 115. The solder mask 115 may be applied and initially thermally cured as described elsewhere herein. Here however, a lithography mask 360 may be positioned over the solder mask 115. The lithography mask 360 may include a transparent plate 365 upon which mask structures 370, 375, 380, 385 and 390 are formed and aligned according to the desired locations of the later-formed openings 135, 140, 125, 117 and 130 shown in FIG. 9. However, in order to achieve the less than full depth openings 125, 130, 135 and 140, the footprints of the mask structures 370, 375, 380 and 390 may be made small enough so that only portions 395, 398, 400 and 403 that are relatively shallow remain unexposed after exposure with the radiation 405. Conversely, the opaque portion 385 has a footprint that is large enough to provide a completely unexposed portion 410 that extends to the surface 117 of the circuit board 20. The mechanics of the creation of the shallow unexposed regions 395, 398, 400 and 403 may be understood by referring now to FIG. 15, which is the portion of FIG. 14 circumscribed by the dashed box 415 shown at greater magnification. Here, the focus will be on the interactions associated with the mask opaque portion 370 and the formation of the shallow underexposed region 395, but will be illustrative of any other such regions and structures. As the photons of the exposure radiation 405 travel past the opaque portion 370 diffraction results in the bending of the pathways of the radiation 405 so that the rays tend to converge towards the bottom of the solder mask 115 thereby leaving the relatively unexposed portion 395 but resulting in the full exposure of the region 420 of the solder mask 115. In this way, a subsequent developing process will result in the underexposed region 395 transforming into the less than full depth opening 135 as shown in FIG. 9. The same would be true for the other openings 125, 130 and 140 that would be formed by way of the underexposed portion 398, 400 and 403 shown in FIG. 14.

After developing, a second thermal cure is performed on the solder mask 115. To neutralize any remaining photoactive compounds in the solder mask 115, a blanket exposure to UV light may be performed. With the openings 119, 125, 130, 135 and 140 (see FIG. 9) formed, flip-chip mounting can then proceed as described elsewhere herein.

Referring again to FIGS. 1 and 2, the exemplary embodiments disclosed herein are not dependent on particular implementations of either the semiconductor chip 15 or the circuit board 20. Thus, the semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. Furthermore, the semiconductor chip 15 could be configured as an interposer with or without some logic circuits. Thus, the term "chip" includes an interposer and vice versa. The semiconductor chip 15 may be constructed of bulk semiconductor, such as silicon or germanium, or semiconductor on insulator materials, such as silicon-on-insulator materials, or even other types of materials. The semiconductor chip 15 may be flip-chip mounted to the circuit board 20 and electrically connected thereto by solder joints 40 or other structures.

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme.

Figure 16:
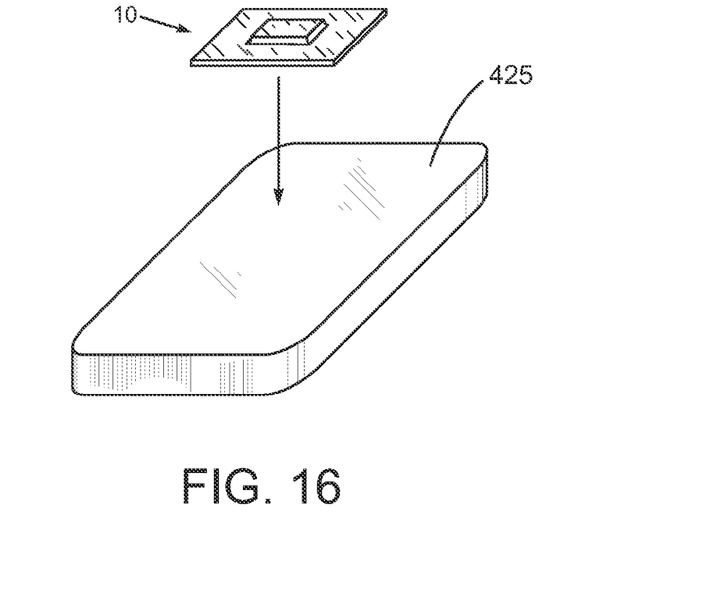
FIG. 16 is a pictorial view depicting the mounting of an exemplary semiconductor chip device in an electronic device.

As shown in FIG. 16, the semiconductor chip device 10 may be coupled to or otherwise mounted in an electronic device 425. The electronic device 425 may be a computer, a digital television, a handheld mobile device, a personal computer, a server, a memory device, an add-in board such as a graphics card, or any other computing device employing semiconductors.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
forming a first opening in a solder mask positioned on a side of a circuit board, the first opening not extending to the side, the solder mask including a photoactive compound;
forming a second opening in the solder mask that extends to the side; and
whereby the first and second openings being formed by lithographically patterning including masking first and second portions of the solder mask, exposing the solder mask with a first light dosage to leave the first and second portions uncured, masking the second portion but not the first portion of the solder mask, exposing the first portion of the solder mask with a second light dosage smaller than the first light dosage to leave a region of the first portion proximate the side uncured, and developing the solder mask to form the first and second openings.

2. The method of claim 1, wherein the side includes a conductor, the second opening exposing at least a portion of the conductor.

3. The method of claim 1, comprising placing an underfill on the solder mask so that a portion thereof projects into the first opening.

4. The method of claim 1, comprising forming the first and second openings with a tapered sidewall.

5. The method claim 1, wherein the first and second openings are formed using instructions stored in a computer readable medium.

6. The method of claim 1, comprising coupling a semiconductor chip to the circuit board.

7. The method of claim 6, wherein the circuit board comprises a chip package substrate.

8. A method of manufacturing, comprising:
coupling a semiconductor chip to a side of a circuit board, the side including a solder mask having photoactive compound, a first opening not extending to the side and a second opening extending to the side, the first and second openings being photolithographically patterned by masking first and second portions of the solder mask, exposing the solder mask with a first light dosage to leave the first and second portions uncured, masking the second portion but not the first portion of the solder mask, exposing the first portion of the solder mask with a second light dosage smaller than the first light dosage to leave a region of the first portion proximate the side uncured, and developing the solder mask to form the first and second openings; and placing an underfill between the semiconductor chip and the solder mask, a portion of the underfill projecting into the first opening.

9. The method of claim 8, wherein the circuit board comprises a chip package substrate.

10. A method of manufacturing, comprising:

forming a first opening in a solder mask positioned on a side of a circuit board, the first opening not extending to the side, the solder mask including a photoactive compound;

forming a second opening in the solder mask that extends to the side; and wherein the forming of the first and second openings includes photolithographically patterning the first and second openings by masking first and second portions of the solder mask, exposing the solder mask with a first light dosage to leave the first and second portions uncured, masking the second portion but not the first portion of the solder mask, exposing the first portion of the solder mask with a second light dosage smaller than the first light dosage to leave a region of the first portion proximate the side uncured, and developing the solder mask to form the first and second openings.

11. A method of manufacturing, comprising:

forming a first opening in a solder mask positioned on a side of a circuit board, the first opening not extending to the side, the solder mask including a photoactive compound;

forming a second opening in the solder mask that extends to the side; and whereby the first and second openings being formed by photolithographically patterning, the photolithographically patterning including masking first and second portions of the solder mask with a mask comprising a first opaque structure having a first lateral dimension and a second opaque structure having a second lateral dimension, exposing the solder mask with light to cure the second portion, wherein the first lateral dimension is selected to enable the light to interact inside the solder mask to leave a region of the first portion proximate the side uncured, and developing the solder mask to form the first and second openings.

12. A method of manufacturing, comprising:

coupling a semiconductor chip to a side of a circuit board, the side including a solder mask having a photoactive compound, a first opening not extending to the side and a second opening extending to the side, the first and second openings being photolithographically patterned by masking first and second portions of the solder mask with a mask comprising a first opaque structure having a first lateral dimension and a second opaque structure having a second lateral dimension, exposing the solder mask with light to cure the second portion, wherein the first lateral dimension is selected to enable the light to interact inside the solder mask to leave a region of the first portion proximate the side uncured, and developing the solder mask to form the first and second openings; and placing an underfill between the semiconductor chip and the solder mask, a portion of the underfill projecting into the first opening.

* * * * *